United States Patent
Chen et al.

(10) Patent No.: US 12,336,352 B2
(45) Date of Patent: Jun. 17, 2025

(54) DISPLAY APPARATUS

(71) Applicant: Au Optronics Corporation, Hsinchu (TW)

(72) Inventors: Po-Jen Chen, Hsinchu (TW); Tai-Tso Lin, Hsinchu (TW); Chen-Yuan Tu, Hsinchu (TW); Chia Wen Dai, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 560 days.

(21) Appl. No.: 17/745,883

(22) Filed: May 17, 2022

(65) Prior Publication Data

US 2023/0197917 A1    Jun. 22, 2023

(30) Foreign Application Priority Data

Dec. 21, 2021   (TW) .................................. 110147887

(51) Int. Cl.
*H10H 20/857*   (2025.01)
*H10H 20/831*   (2025.01)

(52) U.S. Cl.
CPC ........ *H10H 20/857* (2025.01); *H10H 20/831* (2025.01)

(58) Field of Classification Search
CPC ......... H01L 33/62; H01L 33/38; H01L 33/40; H01L 25/0753; H01L 25/167; H10K 39/34; H10H 20/832–835
See application file for complete search history.

(56) References Cited

U.S. PATENT DOCUMENTS

| | | | |
|---|---|---|---|
| 8,035,226 B1 | 10/2011 | Wilcoxen et al. | |
| 9,705,045 B2 | 7/2017 | Huang et al. | |
| 10,608,144 B2 | 3/2020 | Huang et al. | |
| 10,797,034 B2 | 10/2020 | Li | |
| 2003/0164552 A1 | 9/2003 | Tong et al. | |
| 2014/0374149 A1* | 12/2014 | Sanada ............... | H01L 21/4853 174/257 |
| 2016/0240744 A1 | 8/2016 | Huang et al. | |
| 2016/0240758 A1 | 8/2016 | Huang et al. | |
| 2017/0309787 A1 | 10/2017 | Huang et al. | |
| 2018/0261729 A1 | 9/2018 | Huang et al. | |

(Continued)

FOREIGN PATENT DOCUMENTS

| | | |
|---|---|---|
| CN | 109962082 | 7/2019 |
| TW | 578244 | 3/2004 |

(Continued)

*Primary Examiner* — Amar Movva
(74) *Attorney, Agent, or Firm* — JCIPRNET

(57) ABSTRACT

A display apparatus includes a driving backplane and a light-emitting element. The driving backplane includes a substrate, a pixel driving circuit disposed on the substrate and a pad electrically connected to the pixel driving circuit. The pad has a first metal layer, a first intermetallic layer and a first diffusion barrier layer, wherein the first metal layer, the first intermetallic layer and the first diffusion barrier layer are sequentially stacked along a direction away from the substrate. The light-emitting element includes an electrode and a conductive bump electrically connected to the electrode. The conductive bump has a second intermetallic layer, and the first diffusion barrier layer is located between the second intermetallic layer and the first intermetallic layer.

10 Claims, 10 Drawing Sheets

(56) References Cited

U.S. PATENT DOCUMENTS

| | | |
|---|---|---|
| 2019/0198490 A1 | 6/2019 | Li |
| 2019/0341306 A1 | 11/2019 | Yu et al. |
| 2021/0143227 A1* | 5/2021 | Ikeda ..................... H05B 33/24 |
| 2022/0246562 A1* | 8/2022 | Hou ........................ H01L 24/05 |

FOREIGN PATENT DOCUMENTS

| | | |
|---|---|---|
| TW | 201947643 | 12/2019 |
| TW | 202111967 | 3/2021 |
| TW | 202141815 | 11/2021 |
| TW | I745515 | 11/2021 |

\* cited by examiner

DISPLAY APPARATUS

CROSS-REFERENCE TO RELATED APPLICATION

This application claims the priority benefit of Taiwan application serial no. 110147887, filed on Dec. 21, 2021. The entirety of the above-mentioned patent application is hereby incorporated by reference herein and made a part of this specification.

BACKGROUND

Technical Field

The disclosure relates to a display apparatus.

Description of Related Art

A light-emitting diode display panel includes a driving backplane and multiple light-emitting diode elements disposed on the driving backplane. Inheriting the characteristics of light-emitting diodes, light-emitting diode display panels have the advantages of power saving, high efficiency, high brightness and fast response time. In addition, compared with the organic light-emitting diode display panels, the light-emitting diode display panels also have the advantages of easy color correction, long light-emitting life, and no image burn-in. Therefore, the light-emitting diode display panels are regarded as the next generation display technology.

Generally speaking, the pads of the driving backplane of the light-emitting diode display panel need to be provided with a plating layer to facilitate bonding with the conductive bumps of the light-emitting element in the subsequent process. However, in the process of forming the plating layer on the pads of the driving backplane through electrochemical ways, a large amount of hazardous waste liquid is generated, and the material cost of the plating layer (for example, nickel-gold layer) is high.

SUMMARY

The disclosure provides a display apparatus with good performance.

The display apparatus of the disclosure includes a driving backplane and a light-emitting element. The driving backplane includes a substrate, a pixel driving circuit disposed on the substrate and a pad electrically connected to the pixel driving circuit. The pad has a first metal layer, a first intermetallic layer and a first diffusion barrier layer, and the first metal layer, the first intermetallic layer and the first diffusion barrier layer are sequentially stacked along a direction away from the substrate. The light-emitting element includes an electrode and a conductive bump electrically connected to the electrode. The conductive bump has a second intermetallic layer, and the first diffusion barrier layer is located between the second intermetallic layer and the first intermetallic layer.

In an embodiment of the disclosure, the first metal layer includes copper, and the first intermetallic layer includes copper and tin.

In an embodiment of the disclosure, the first metal layer includes copper, and the second intermetallic layer includes copper and tin.

In an embodiment of the disclosure, the first intermetallic layer includes $(Cu, Ni)_6Sn_5$, $(Cu, Ni)_3Sn$, $(Cu, Ni)_3Sn_4$ or a combination of at least two of the above.

In an embodiment of the disclosure, the second intermetallic layer includes $(Cu, Ni)_6Sn_5$, $(Cu, Ni)_3Sn$, $(Cu, Ni)_3Sn_4$, or a combination of at least two of the above.

In an embodiment of the disclosure, the first diffusion barrier layer includes tungsten and nickel.

In an embodiment of the disclosure, the first diffusion barrier layer further includes copper, tin, or a combination of copper and tin.

In an embodiment of the disclosure, a weight percentage of tungsten in the first diffusion barrier layer falls within a range of 15% to 70%.

In an embodiment of the disclosure, a weight percentage of nickel in the first diffusion barrier layer is greater than 5%.

In an embodiment of the disclosure, the pad further includes an auxiliary metal layer and an auxiliary protective layer, and the auxiliary metal layer, the auxiliary protective layer, the first metal layer, the first intermetallic layer, the first diffusion barrier layer and the second intermetallic layer are sequentially stacked along the direction away from the substrate.

DESCRIPTION OF EMBODIMENTS

Figure 1A:
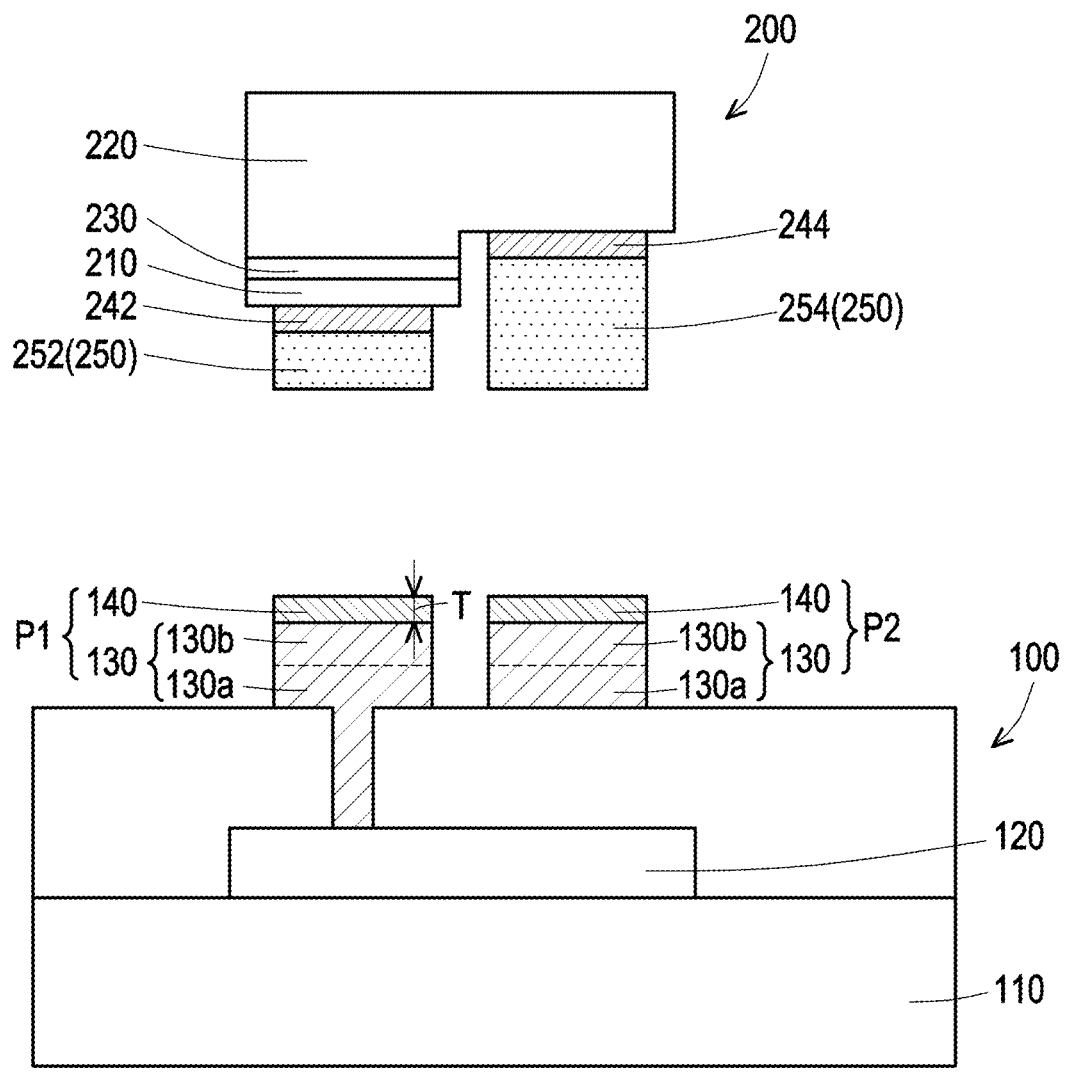
FIGS. 1A to 1B are schematic cross-sectional views of a manufacturing process of a display apparatus 10 according to an embodiment of the disclosure.

Reference will now be made in detail to exemplary embodiments of the disclosure, examples of which are illustrated in the accompanying drawings. Wherever possible, the same reference numerals are used in the drawings and description to refer to the same or like parts.

It will be understood that when an element such as a layer, a film, a region, or a substrate is referred to as being "on" or "connected to" another element, it may be directly on or connected to the another element, or intervening elements may be present. In contrast, when an element is referred to as being "directly on" or "directly connected to" another element, there are no intervening elements present. As used herein, "connected" may refer to a physical and/or electrical connection. Furthermore, "electrically connected" or "coupled" may refer to a case where other elements exist between two elements.

As used herein, "about," "approximately," or "substantially" includes the stated value and the average within acceptable deviations from the particular value as determined by one of ordinary skill in the art, in which the measurement in question and the specific amount of error associated with the measurement is taken into account (i.e., the limitations of the measurement system). For example, "about" may mean within one or more standard deviations of the stated value, or within ±30%, ±20%, ±10%, or ±5%. Furthermore, as used herein, "about," "approximately" or "substantially" may mean that a more acceptable range of deviation or standard deviation may be selected depending on optical properties, etching properties or other properties, and it is not required to apply one standard deviation to all properties.

Unless otherwise defined, all terms (including technical and scientific terms) used herein have the same meaning as commonly understood by one of ordinary skill in the art to which the disclosure pertains. It will be further understood that terms such as those defined in commonly used dictionaries should be construed as having meanings consistent with their meanings in the context of the related art and the disclosure, and are not to be construed as having idealized or overly formal meanings, unless specifically defined as such herein.

Figure 1B:
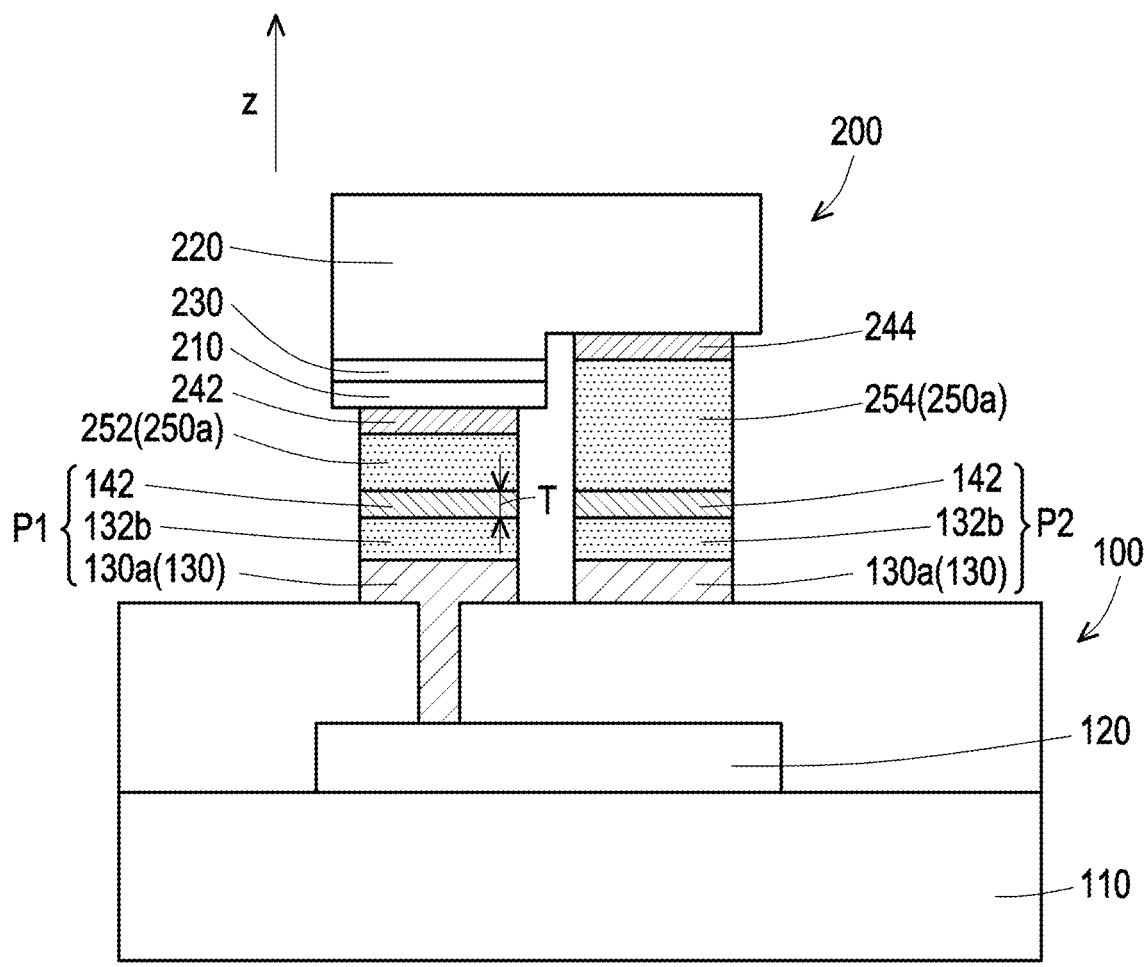

FIGS. 1A to 1B are schematic cross-sectional views of a manufacturing process of a display apparatus 10 according to an embodiment of the disclosure.

With reference to FIG. 1A, first, a driving backplane 100 is provided. The driving backplane 100 includes a substrate 110. For example, in this embodiment, the material of the substrate 110 may be glass, quartz, organic polymer, or other applicable materials.

The driving backplane 100 further includes a pixel driving circuit 120 disposed on the substrate 110. For example, in this embodiment, the pixel driving circuit 120 may include a data line (not shown), a scan line (not shown), a power line (not shown), a common line (not shown), a first transistor (not shown), a second transistor (not shown) and a capacitor (not shown). The first terminal of the first transistor is electrically connected to the data line. The control terminal of the first transistor is electrically connected to the scan line. The second terminal of the first transistor is electrically connected to the control terminal of the second transistor. The first terminal of the second transistor is electrically connected to the power line. The capacitor is electrically connected to the second terminal of the first transistor and the first terminal of the second transistor. However, the disclosure is not limited thereto, and in other embodiments, the pixel driving circuit 120 may be other types of circuits.

The driving backplane 100 further includes pads P1 and P2 that are electrically connected to the pixel driving circuit 120. For example, in this embodiment, the pads P1 and P2 include a first pad P1 and a second pad P2 that are separated from each other in structure. The first pad P1 is electrically connected to the second terminal (not shown) of the second transistor the pixel driving circuit 120, and the second pad P2 is electrically connected to the common line (not shown) of the pixel driving circuit 120, but the disclosure is not limited thereto.

Each of the pads P1 and P2 has a first metal layer 130 and a first protective layer 140 covering the first metal layer 130. The first protective layer 140 may protect the first metal layer 130 so that the first metal layer 130 is not easily oxidized. In this embodiment, the thickness T of the first protective layer 140 may fall within the range of 5 nm to 50 nm, but the disclosure is not limited thereto.

In this embodiment, the first metal layer 130 may be selectively a copper layer, and the first protective layer 140 may allow copper to be diffused therein at a high temperature (for example, 150° C. to 300° C.). The first protective layer 140 may be an inorganic layer or an organic layer. More specifically, the first protective layer 140 may be metal, alloy, ceramic, metal oxide or nitride. For example, the first protective layer 140 may be chromium (Cr), copper alloy, molybdenum (Mo), molybdenum alloy, silicon oxide (SiOx), nitrogen oxide (SiNx), tantalum (Ta), tantalum alloy, aluminum oxide (AlOx), indium tin oxide (ITO), indium zinc oxide (IZO), aluminum zinc oxide (AZO), titanium nitride (TiNx), tungsten (W), tungsten Alloy, silicon (Si), sapphire, acrylics or other applicable materials. In the following description, the first protective layer 140 is exemplified by tungsten nickel (WNi), but the disclosure is not limited thereto.

With reference to FIG. 1A, next, a light-emitting element 200 is provided. In this embodiment, the light-emitting element 200 is, for example, a micro light-emitting diode (μLED). The light-emitting element 200 includes electrodes 242 and 244 and conductive bumps 252 and 254 electrically connected to the electrodes 242 and 244. In detail, in this embodiment, the light-emitting element 200 further includes a first-type semiconductor layer 210, a second-type semiconductor layer 220 and an active layer 230. The active layer 230 is disposed between the first-type semiconductor layer 210 and the second-type semiconductor layer 220. The electrodes 242 and 244 include a first electrode 242 and a second electrode 244. The first electrode 242 and the second electrode 244 are electrically connected to the first-type semiconductor layer 210 and the second-type semiconductor layer 220, respectively. The conductive bumps 252 and 254 include a first conductive bump 252 and a second conductive bump 254. The first conductive bump 252 and the second conductive bump 254 are electrically connected to the first electrode 242 and the second electrode 244, respectively. Each conductive bump 252 and 254 includes a second metal layer 250. For example, in this embodiment, the second metal layer 250 includes, for example, tin (Sn), but the disclosure is not limited thereto.

Please refer to FIGS. 1A and 1B. Next, the light-emitting element 200 is disposed on the driving backplane 100, and the light-emitting element 200 is electrically connected to the driving backplane 100. Specifically, in this embodiment, a heating process may be performed to eutectic bond the conductive bumps 252 and 254 of the light-emitting element 200 and the pads P1 and P2 of the driving backplane 100. During the eutectic bonding process, a part of the second metal layer 250 of the conductive bumps 252 and 254 passes through the first protective layer 140 and diffuses toward the first metal layer 130, so that a part 130b of the first metal layer 130 of the pads P1 and P2 reacts with the part of the second metal layer 250 diffused therein to form a first intermetallic layer 132b. At the same time, a part of the first metal layer 130 of the pads P1 and P2 passes through the first protective layer 140 and diffuses toward the second metal layer 250, so that at least a part of the second metal layer 250 reacts with the part of the first metal layer 130 diffused therein to form a second intermetallic layer 250a.

In this embodiment, during the eutectic bonding process, the first protective layer 140 has the function of preventing continuous rapid diffusion. Due to the barrier function of the first protective layer 140, the part 130a of the first metal layer 130 of the pads P1 and P2 close to the substrate 110 does not react with other substances and retains the original properties of the first metal layer 130. In addition, during the eutectic bonding process, since a part of the second metal layer 250 and a part of the first metal layer 130 pass through the first protective layer 140 and diffuse toward each other, a trace amount of the first metal in the first metal layer 130 and a trace amount of the second metal in the second metal layer 250 also diffuse and remain in the first protective layer 140, so that the first protective layer 140 is transformed into a first diffusion barrier layer 142 with trace amounts of the first metal and the second metal. Here, the display apparatus 10 of this embodiment is completed.

With reference to FIG. 1B, the display apparatus 10 includes the driving backplane 100 and the light-emitting element 200. The driving backplane 100 includes the substrate 110, the pixel driving circuit 120 disposed on the substrate 110, and the pads P1 and P2 electrically connected to the pixel driving circuit 120. The pads P1 and P2 has the first metal layer 130, the first intermetallic layer 132b and the first diffusion barrier layer 142, and the first metal layer 130, the first intermetallic layer 132b and the first diffusion barrier layer 142 are sequentially stacked along a direction z away from the substrate 110. The light-emitting element 200 includes the electrodes 242 and 244 and the conductive bumps 252 and 254. The conductive bumps 252 and 254 have the second intermetallic layer 250a, and the first diffusion barrier layer 142 is located between the second intermetallic layer 250a and the first intermetallic layer 132b. In this embodiment, the upper and lower sides of the first intermetallic layer 132b are in contact with the first diffusion barrier layer 142 and the first metal layer 130, respectively, and the upper and lower sides of the first diffusion barrier layer 142 are in contact with the second intermetallic layer 250a and the first intermetallic layer 132b, respectively.

For example, in this embodiment, the first metal layer 130 includes copper; the first intermetallic layer 132b includes copper and tin; the first diffusion barrier layer 142 includes tungsten and nickel; and the second intermetallic layer 250a includes copper and tin. In this embodiment, the first diffusion barrier layer 142 further includes copper, tin, or a combination of copper and tin.

In this embodiment, the first intermetallic layer 132b includes $(Cu, Ni)_6Sn_5$, $(Cu, Ni)_3Sn$, $(Cu, Ni)_3Sn_4$, or a combination of at least two of the above, where $0.05 \leq x \leq 0.7$, $0.05 \leq y \leq 0.7$, and $0.1 \leq z \leq 0.9$. More specifically, in this embodiment, the first intermetallic layer 132b includes $Cu_6Sn_5$, $(Cu_{1-x}Ni_x)_6Sn_5$, $Cu_3Sn$, $(Cu_{1-y}Ni_y)_3Sn$, $(Cu_{1-z}Ni_z)_3Sn_4$, or a combination of at least two of the above. In this embodiment, the first diffusion barrier layer 142 includes, for example, tungsten nickel (WNi), but the disclosure is not limited thereto. In this embodiment, the second intermetallic layer 250a includes $(Cu, Ni)_6Sn_5$, $(Cu, Ni)_3Sn$, $(Cu,$ $Ni)_3Sn_4$, or a combination of at least two of the above. More specifically, in this embodiment, the second intermetallic layer 250a includes $Cu_6Sn_5$, $(Cu_{1-x}Ni_x)_6Sn_5$, $Cu_3Sn$, $(Cu_{1-y}Ni_y)_3Sn$, $(Cu_{1-z}Ni_z)_3Sn_4$, or a combination of at least two of the above, where $0.05 \leq x \leq 0.7$, $0.05 \leq y \leq 0.7$, and $0.1 \leq z \leq 0.9$.

In this embodiment, the weight percentage of tungsten in the first diffusion barrier layer 142 may fall within the range of 15% to 70%, and the weight percentage of nickel in the first diffusion barrier layer 142 may be greater than 5%, but the disclosure is not limited thereto.

Table 1 shows the relationship between the composition and thickness T of the first protective layer 140 of the pads P1 and P2 in FIG. 1A and the bonding result between the light-emitting element 200 and the driving backplane 100 in FIG. 1B when the first metal layer 130 of the pads P1 and P2 of FIG. 1A includes copper and the thickness of copper is 600 nm. Please refer to Table 1. It may be seen from the experimental results in Table 1 that when the thickness T of the first protective layer 140 (that is, tungsten nickel) is 500 nm and 300 nm, respectively, the bonding between the light-emitting element 200 and the driving backplane 100 is poor; when the thickness T of the first protective layer 140 (that is, the tungsten nickel oxide) is 40 nm and 20 nm, respectively, the bonding between the light-emitting element 200 and the driving backplane 100 is good. It may be seen that, in an embodiment, the thickness T of the first protective layer 140 (that is, tungsten nickel) is preferably less than or equal to 40 nm.

TABLE 1

| Composition of the first protective layer of the pads including tungsten nickel | | | | | | | | | | |
|---|---|---|---|---|---|---|---|---|---|---|
| Weight percentage of tungsten in tungsten nickel (%) | 60 | 40 | 60 | 40 | 60 | 50 | 40 | 60 | 50 | 40 |
| Weight percentage of nickel in tungsten nickel (%) | 40 | 60 | 40 | 60 | 40 | 50 | 60 | 40 | 50 | 60 |
| Thickness of tungsten nickel (nm) | 500 | 500 | 300 | 300 | 40 | 40 | 40 | 20 | 20 | 20 |
| Bonding result | NG | NG | NG | NG | OK | OK | OK | OK | OK | OK |

Figure 2:
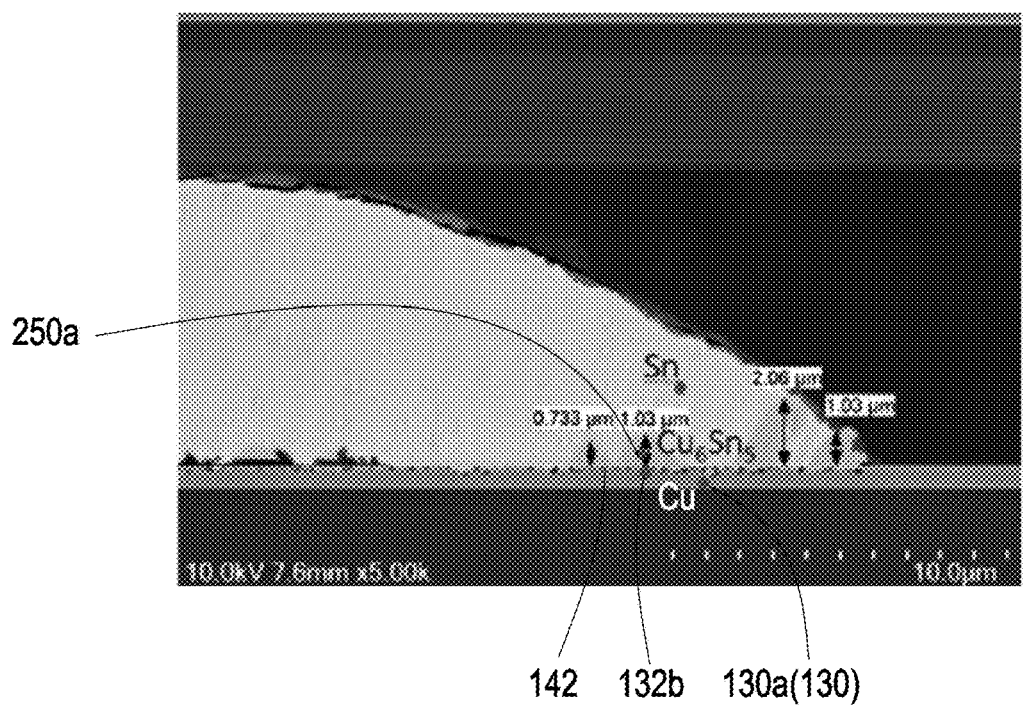
FIG. 2 is a photograph of a partial cross-section of a display apparatus according to an embodiment of the disclosure taken with an electron microscope.

Please refer to FIG. 1A and the third column from the right in Table 1. In an embodiment, the composition of the first protective layer 140 of the pads P1 and P2 includes tungsten nickel, and the weight percentage of tungsten in the tungsten nickel is 60%, and the weight percentage of nickel in the tungsten nickel is 40%, and the thickness T of the tungsten nickel is 20 nm. FIG. 2 is a photograph of a partial cross-section of a display apparatus according to an embodiment of the disclosure taken with an electron microscope. In detail, FIG. 2 is a photograph of a partial cross-section of the display apparatus 10 formed using the pads P1 and P2 including the first protective layer 140 described in this paragraph.

Please refer to FIGS. 1A, 1B and 2. In an embodiment, the composition of the first protective layer 140 of the pads P1 and P2 includes tungsten nickel, and the weight percentage of tungsten in the tungsten nickel is 60%, and the weight percentage of nickel in the tungsten nickel is 40%, and the thickness T of the first protective layer 140 (that is, the tungsten nickel) is 20 nm. It may be seen from FIG. 2 that after the eutectic bonding using the pads P1 and P2 including the first protective layer 140 described in this paragraph, the amount of the first intermetallic layer 132b (dark shaded area) and the second intermetallic layer 250a (dark shaded area) is small. That is, the first protective layer 140 (that is, tungsten nickel) including 60% by weight of tungsten and 40% by weight of nickel may allow the light-emitting element 200 to be bonded to the driving backplane 100, but the bonding result of the two is not ideal.

Figure 3:
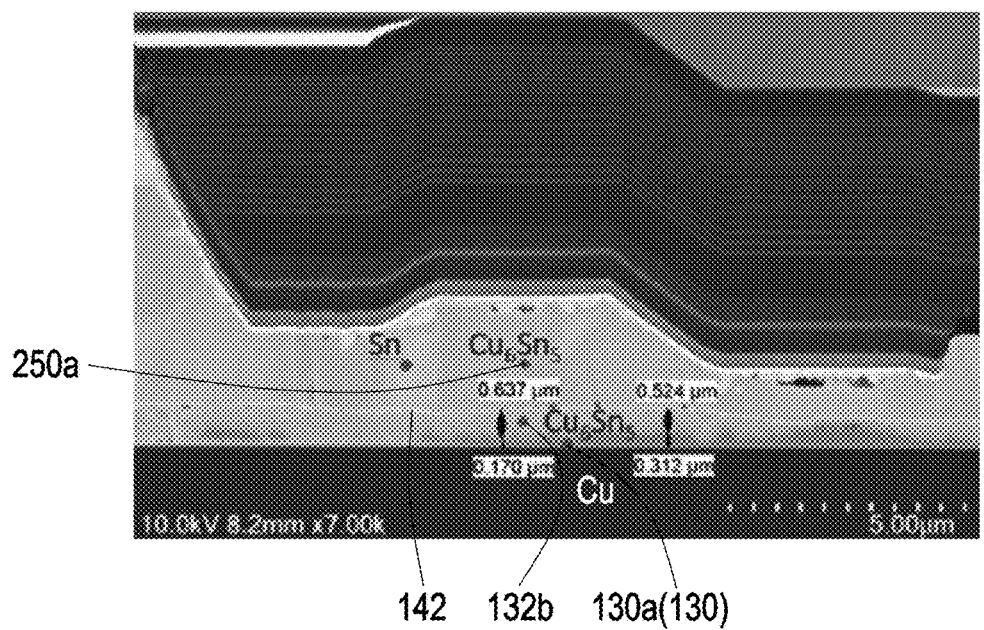
FIG. 3 is a photograph of a partial cross-section of a display apparatus according to an embodiment of the disclosure taken with an electron microscope.

Please refer to FIG. 1A and the second column from the right in Table 1. In an embodiment, the composition of the first protective layer 140 of the pads P1 and P2 includes tungsten nickel, and the weight percentage of tungsten in the tungsten nickel is 50%, and the weight percentage of nickel in the tungsten nickel is 50%, and the thickness T of the first protective layer 140 (that is, tungsten nickel) is 20 nm. FIG. 3 is a photograph of a partial cross-section of a display apparatus according to an embodiment of the disclosure taken with an electron microscope. Please refer to FIGS. 1A, 1B and 3. In detail, FIG. 3 is a photograph of a partial cross-section of the display apparatus 10 formed using the pads P1 and P2 including the first protective layer 140 described in this paragraph.

Please refer to FIGS. 1A, 1B and 3. In an embodiment, the composition of the first protective layer 140 of the pads P1 and P2 includes tungsten nickel, and the weight percentage of tungsten in the tungsten nickel is 50%, and the weight percentage of nickel in the tungsten nickel is 50%, and the thickness T of the first protective layer 140 (that is, the tungsten nickel) is 20 nm. It may be seen from FIG. 3 that after the eutectic bonding using the pads P1 and P2 including the first protective layer 140 described in this paragraph, the continuous and complete first intermetallic layer 132b and second intermetallic layer 250a (dark shaded areas) may be formed. That is, the first protective layer 140 (that is, tungsten nickel) including 50% by weight of tungsten and 50% by weight of nickel may allow the light-emitting element 200 to be bonded to the driving backplane 100, and the bonding result of the two is ideal.

Figure 4:
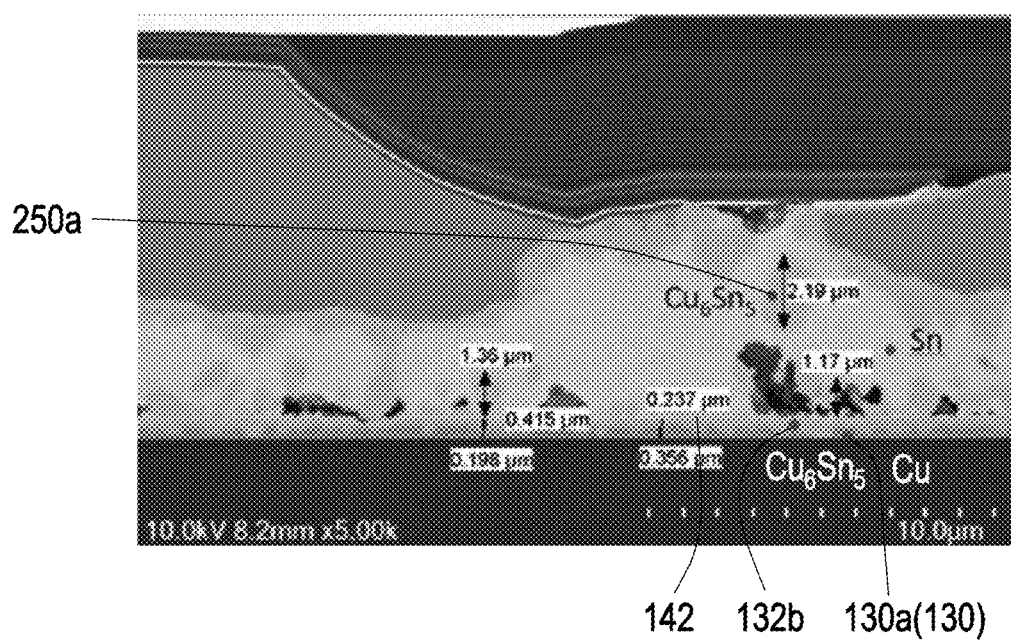
FIG. 4 is a photograph of a partial cross-section of a display apparatus according to an embodiment of the disclosure taken with an electron microscope.

Please refer to FIG. 1A and the first column from the right in Table 1. In an embodiment, the composition of the first protective layer 140 of the pads P1 and P2 includes tungsten nickel, and the weight percentage of tungsten in the tungsten nickel is 40%, and the weight percentage of nickel in the tungsten nickel is 60%, and the thickness T of the first protective layer 140 (that is, tungsten nickel) is 20 nm. FIG. 4 is a photograph of a partial cross-section of a display apparatus according to an embodiment of the disclosure taken with an electron microscope. Please refer to FIGS. 1A, 1B and 4. In detail, FIG. 4 is a photograph of a partial cross-section of the display apparatus 10 formed using the pads P1 and P2 including the first protective layer 140 described in this paragraph.

Please refer to FIGS. 1A, 1B and 4. In an embodiment, the composition of the first protective layer 140 of the pads P1 and P2 includes tungsten nickel, and the weight percentage of tungsten in the tungsten nickel is 40%, and the weight percentage of nickel in the tungsten nickel is 60%, and the thickness T of the first protective layer 140 (that is, the tungsten nickel) is 20 nm. It may be seen from FIG. 4 that after the eutectic bonding using the pads P1 and P2 including the first protective layer 140 described in this paragraph, a sufficient amount of the first intermetallic layer 132b and the second intermetallic metal 250a may be formed. That is, the first protective layer 140 (that is, tungsten nickel) including 40% by weight of tungsten and 60% by weight of nickel may allow the light-emitting element 200 to be bonded to the driving backplane 100, and the bonding result of the two is still ideal.

In view of the experimental results of FIGS. 2, 3 and 4, it may be known that the weight percentage of tungsten in the first protective layer 140 (that is, tungsten nickel) of the pads P1 and P2 in FIG. 1A is preferably 5% to 60%, and the weight percentage of nickel in the first protective layer 140 of the pads P1 and P2 is preferably greater than 40%, but the disclosure is not limited thereto.

Table 2 shows the relationship between the process parameters of various heating processes and the bonding result of the light-emitting element 200 and the driving backplane 100 shown in FIG. 1B when the first metal layer 130 of the pads P1 and P2 of FIG. 1A includes copper and the thickness of copper is 600 nm, and the first protective layer 140 of the pads P1 and P2 includes tungsten nickel and the thickness of tungsten nickel is 20 nm.

Please refer to Table 2. When the heating temperature of the heating process is 230° C. and the heating time is 30 seconds, the bonding result between the light-emitting element 200 and the driving backplane 100 is good; under the process parameters of a deteriorated heating process (that is, the heating time of the heating process is extended to 60 seconds), the bonding result between the light-emitting element 200 and the driving backplane 100 is also good. In light of the above, even under the process conditions of the deteriorated heating process, the light-emitting element 200 may still be well bonded to the driving backplane 100.

TABLE 2

| | Process parameters of the heating process | |
|---|---|---|
| | Heating temperature: 230° C. Heating time: 30 sec. | Heating temperature: 230° C. Heating time: 60 sec. |
| Bonding result | OK | OK |

Table 3 shows the changes in the oxygen content of the first metal layer 130 after the various pads P1 and P2 of FIG. 1A are heated by a hot plate at 160° C. for 4 hours.

TABLE 3

| | Pads P1 and P2 | |
|---|---|---|
| | Composition of the first protective layer 140: tungsten nickel Thickness of the first protective layer 140: 200 Å Composition of the first metal layer 130: copper | Composition of the first protective layer 140: tungsten nickel Thickness of the first protective layer 140: 400 Å Composition of the first metal layer 130: copper |
| Change in the oxygen content of the first protective layer 140 | Slightly higher | Slightly higher |
| Change in the oxygen content of the first metal layer 130 | No change | No change |

It may be seen from the experimental results in Table 3 that after the pads P1 and P2 of the driving backplane 100 are heated at a high temperature for a long time, the first metal layer 130 of the pads P1 and P2 is not easily oxidized. From this, it may be seen that even if the multiple pads P1 and P2 of the driving backplane 100 and the multiple light-emitting elements 200 are bonded to each other through multiple heating processes, and the pads P1 and P2 that remain on the driving backplane 100 and have not been bonded are also heated in the above-described multiple heating processes, the first protective layer 140 of the pads P1 and P2 that have not been bonded still have the function of protecting the first metal layer 130 from oxidation.

It should be noted here that the following embodiments use the reference numerals and part of the contents of the foregoing embodiments, and the same reference numerals are used to designate the same or similar elements, and the description of the same technical contents is omitted. For the description of the omitted part, reference may be made to the foregoing embodiments, and the following embodiments will not repeat those contents.

Figure 5A:
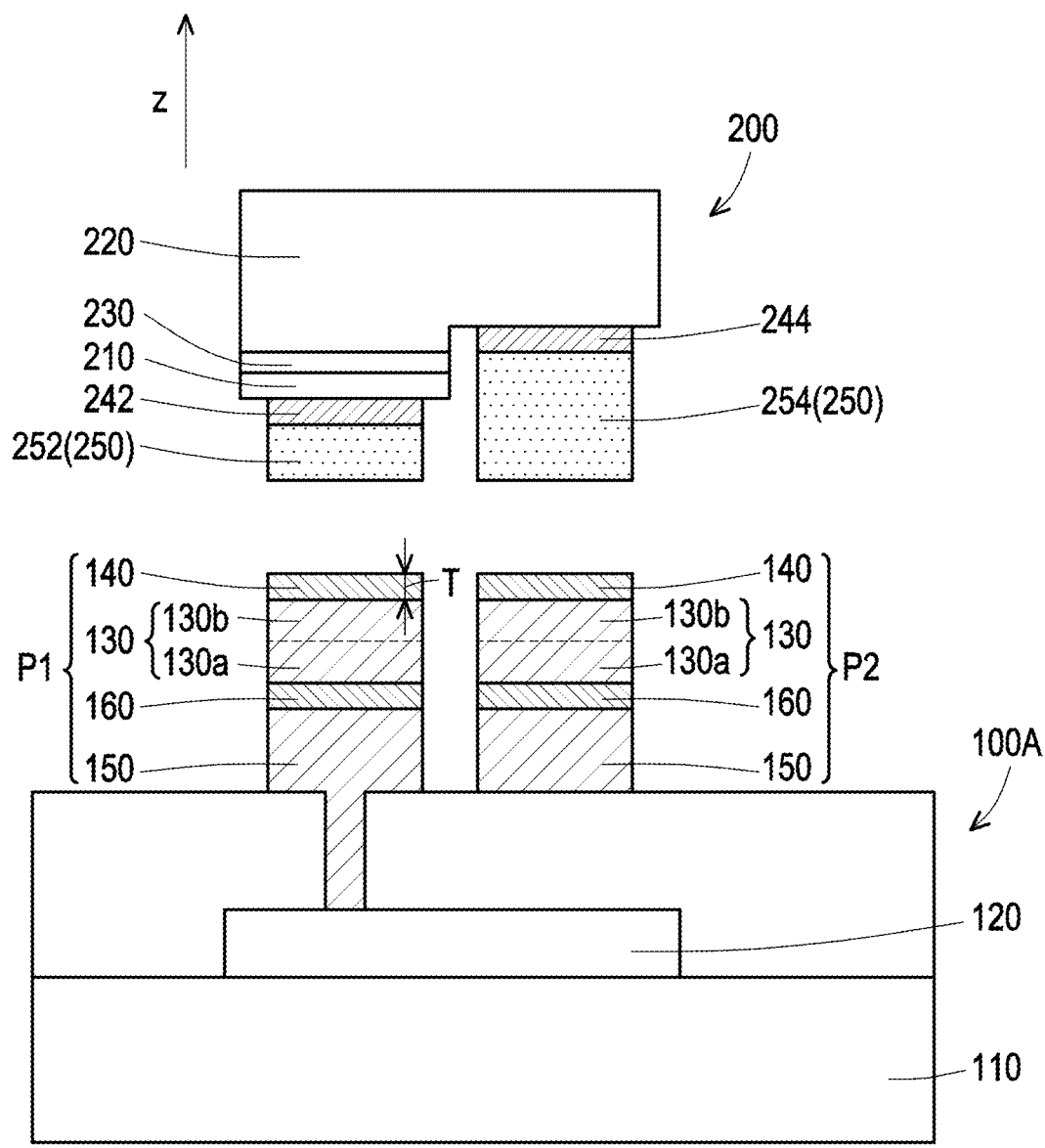
FIGS. 5A to 5B are schematic cross-sectional views of a manufacturing process of a display apparatus 10A according to an embodiment of the disclosure.
Figure 5B:
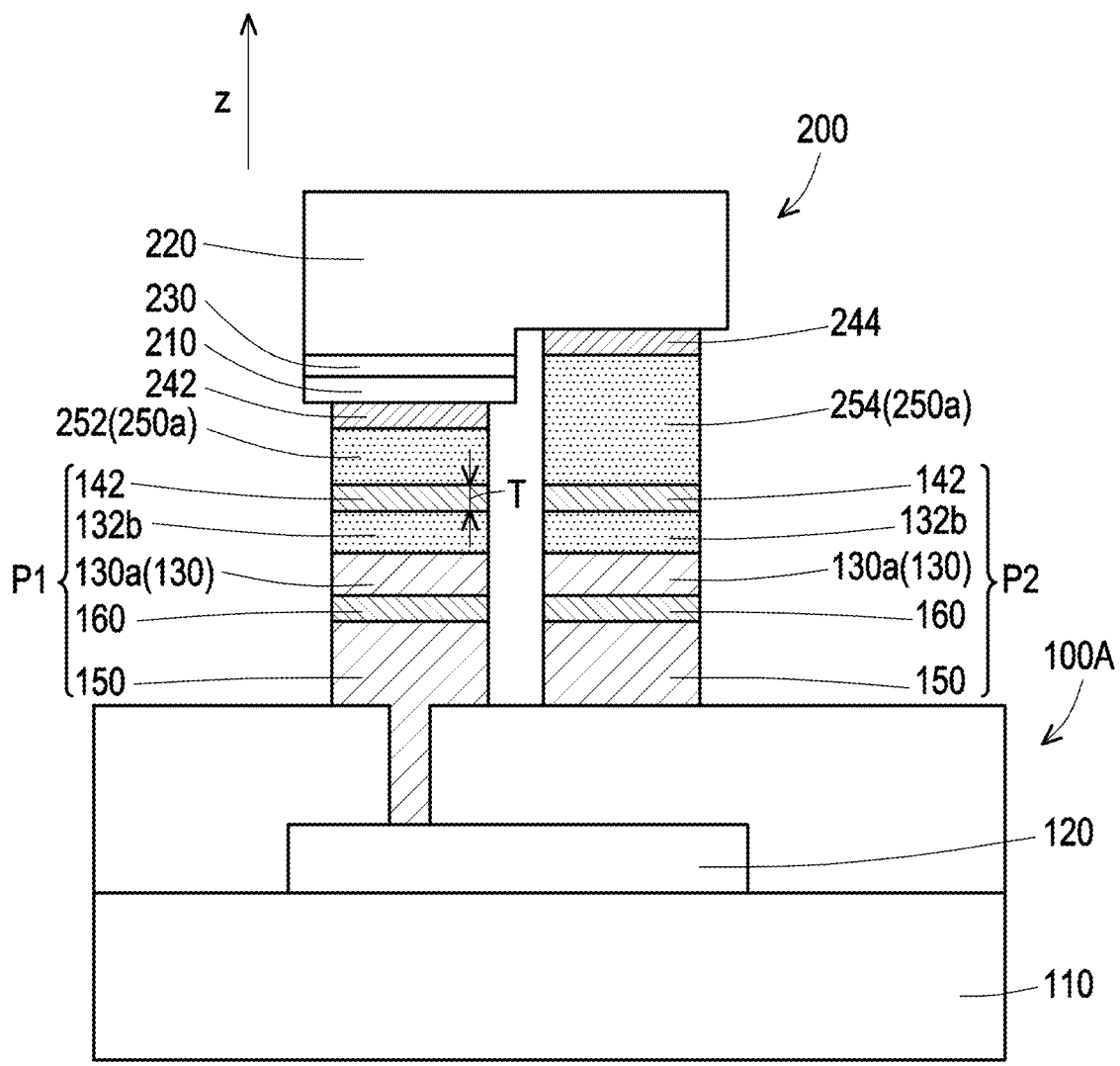

FIGS. 5A to 5B are schematic cross-sectional views of a manufacturing process of a display apparatus 10A according to an embodiment of the disclosure.

The display apparatus 10A and its manufacturing process shown in FIGS. 5A to 5B are similar to the display apparatus 10 and its manufacturing process shown in FIGS. 1A to 1B. The difference between the two is that the pads P1 and P2 are different.

Please refer to FIG. 5A. In this embodiment, the pads P1 and P2 further include an auxiliary metal layer 150 and an auxiliary protective layer 160. Before the light-emitting element 200 is bonded, the auxiliary metal layer 150, the auxiliary protective layer 160, the first metal layer 130 and the first protective layer 140 are sequentially stacked along the direction z away from the substrate 110. In this embodiment, for applicable materials of the auxiliary metal layer 150 and the auxiliary protective layer 160, reference may be made to the applicable materials of the first metal layer 130 and the first protective layer 140 described above, which will not be repeated here.

Please refer to FIGS. 5A and 5B. In this embodiment, during the bonding process of the light-emitting element 200, a part of the second metal layer 250 of the conductive bumps 252 and 254 passes through the first protective layer 140 and diffuses toward the first metal layer 130, so that a part 130b of the first metal layer 130 of the pads P1 and P2 reacts with the part of the second metal layer 250 diffused therein to form a first intermetallic layer 132b. At the same time, a part of the first metal layer 130 of the pads P1 and P2 passes through the first protective layer 140 and diffuse toward the second metal layer 250, so that at least a part of the second metal layer 250 reacts with the part of the first metal layer 130 diffused therein to form a second intermetallic layer 250a. In this embodiment, since the auxiliary metal layer 150 and the auxiliary protective layer 160 are disposed under the first metal layer 130 and the first protective layer 140, during the eutectic bonding process, the second metal layer 250 may not diffuse to the auxiliary metal layer 150 and the auxiliary protective layer 160, and the auxiliary metal layer 150 and the auxiliary protective layer 160 may retain their original properties. With reference to FIG. 5B, in this embodiment, after the light-emitting element 200 is bonded, the auxiliary metal layer 150, the auxiliary protective layer 160, the first metal layer 130, the first intermetallic layer 132b, the first diffusion barrier layer 142 and the second intermetallic layer 250a are sequentially stacked along the direction z away from the substrate 110.

Please refer to FIG. 5B. In this embodiment, the pads P1 and P2 may be well bonded to the light-emitting element 200. In addition, if the light-emitting element 200 bonded to the pads P1 and P2 is found to be abnormal, and the abnormal light-emitting element 200 is removed from the pads P1 and P2, part of the pads P1 and P2 remaining on the substrate 110 may also be well bonded to a light-emitting element 200' for repair (shown in FIGS. 6C and 6D), which are illustrated below with reference to FIGS. 6A to 6D.

FIGS. 6A to 6D are schematic cross-sectional views of a repair process of a display apparatus 10B according to an embodiment of the disclosure.

Figure 6A:
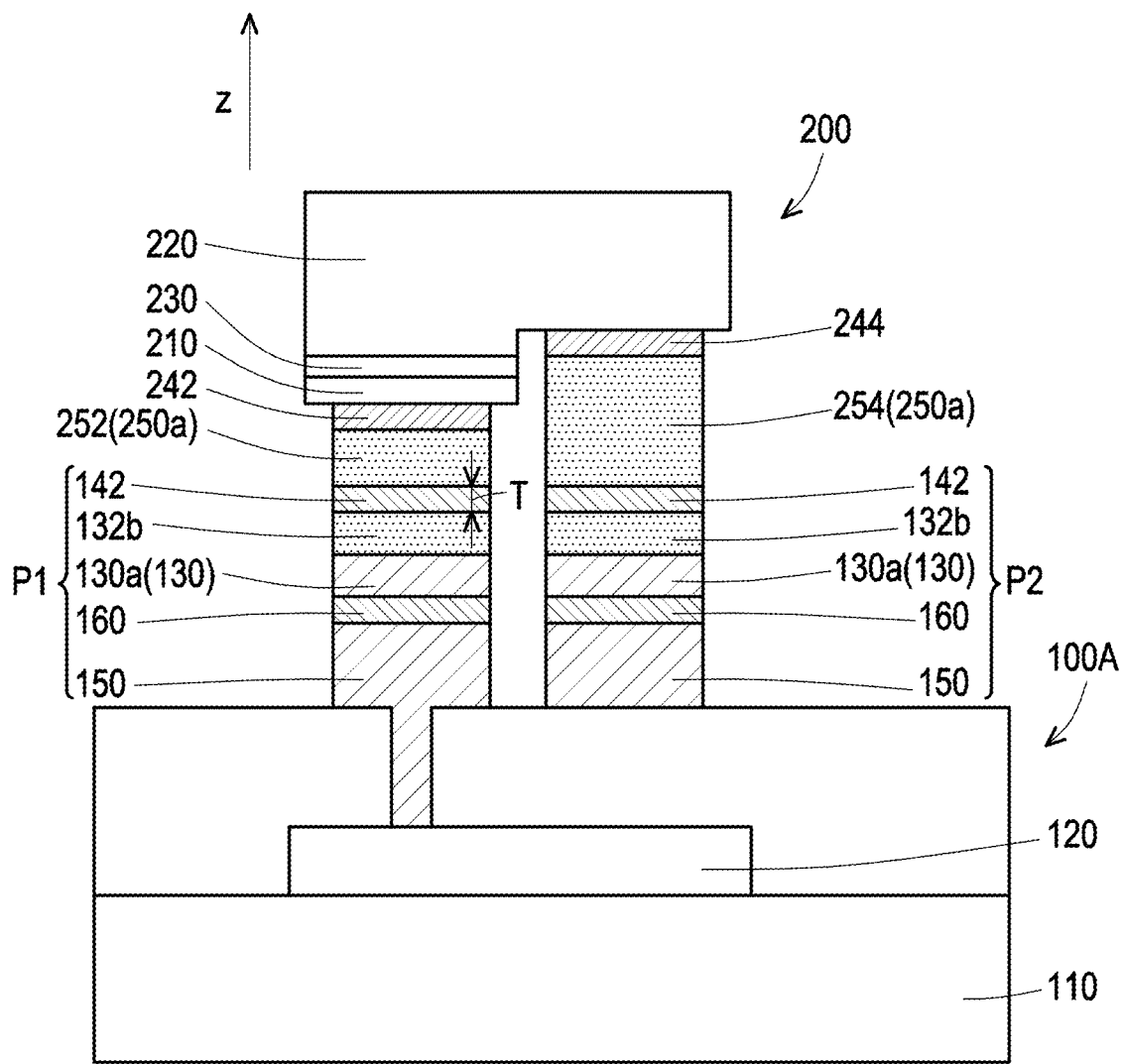
FIGS. 6A to 6D are schematic cross-sectional views of a repair process of a display apparatus 10B according to an embodiment of the disclosure.

Please refer to FIG. 6A. The display apparatus 10B of FIG. 6A is similar to the display apparatus 10A of FIG. 5B, the difference between the two is that the light-emitting element 200 of FIG. 5B is normal, but the light-emitting element 200 of FIG. 6A is abnormal and needs to be removed.

Figure 6B:
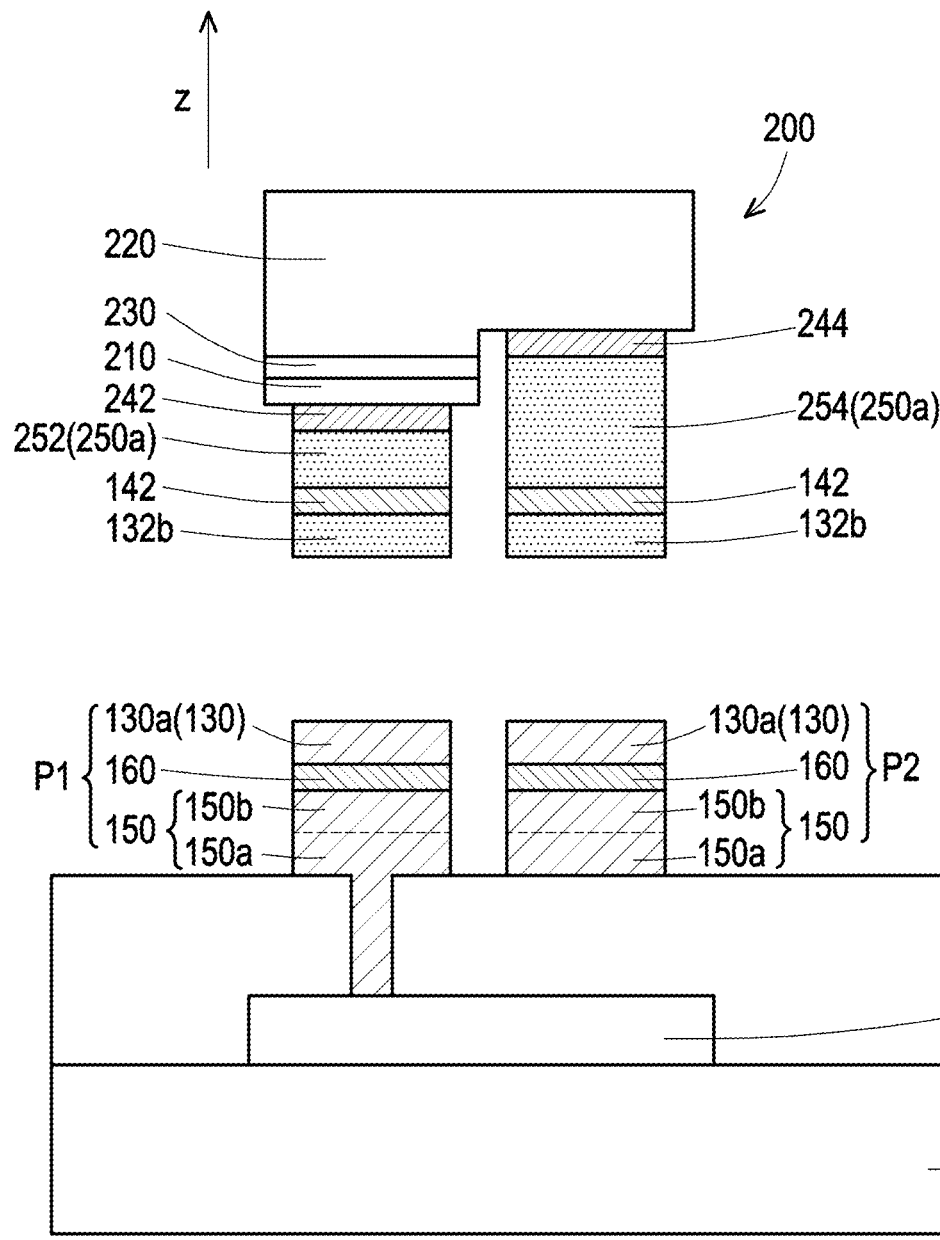

Please refer to FIGS. 6A and 6B. When the abnormal light-emitting element 200 is removed from the substrate 110, the first semiconductor layer 210, the second semiconductor layer 220, the active layer 230 and the electrodes 242 and 244 of the light-emitting element 200 are removed, and in addition, the second intermetallic layer 250a, the first diffusion barrier layer 142 and the first intermetallic layer 132b are also removed, leaving the first metal layer 130, the auxiliary protection layer 160 and the auxiliary metal layer 150 of the pads P1 and P2.

Figure 6C:
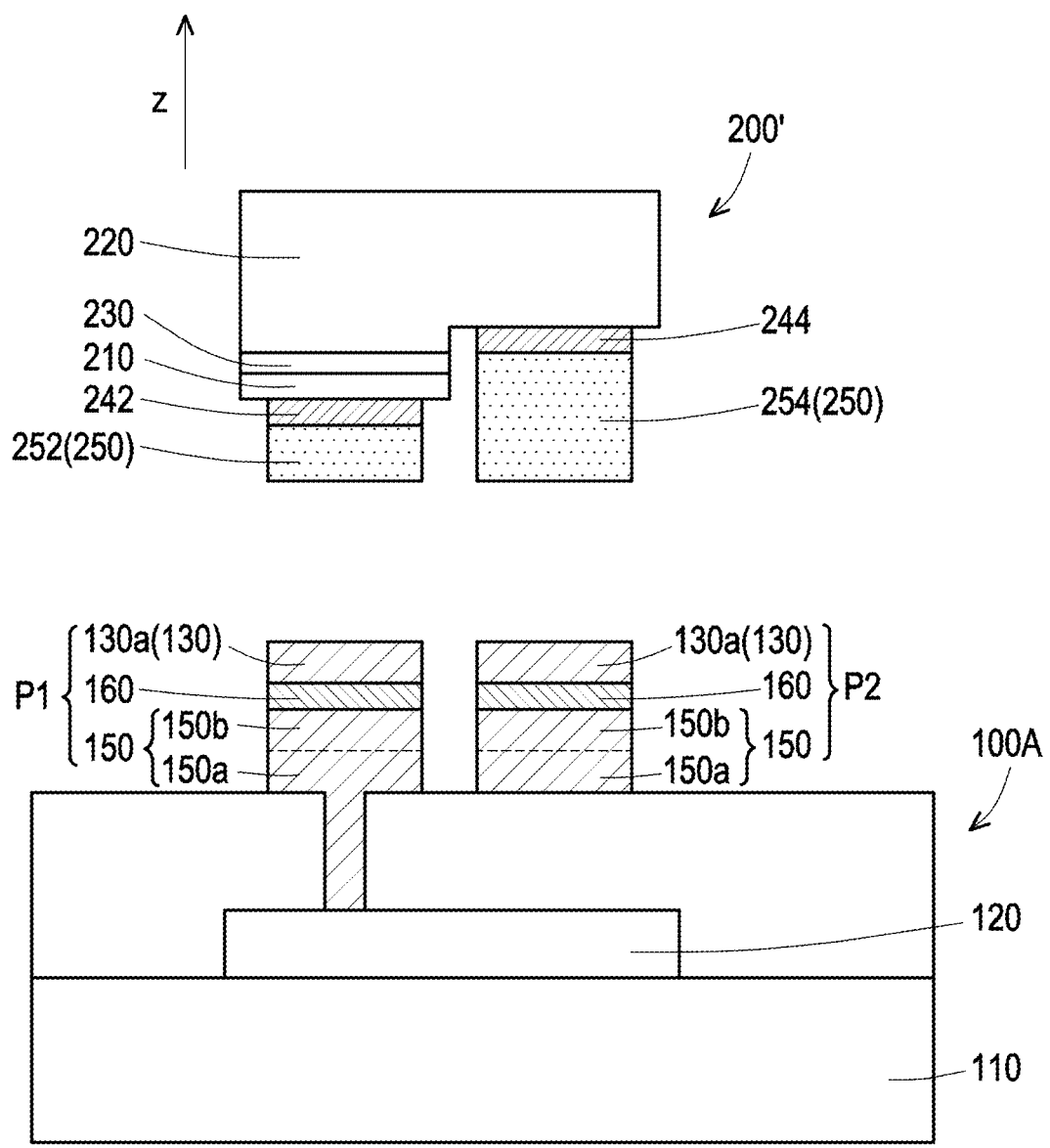
Figure 6D:
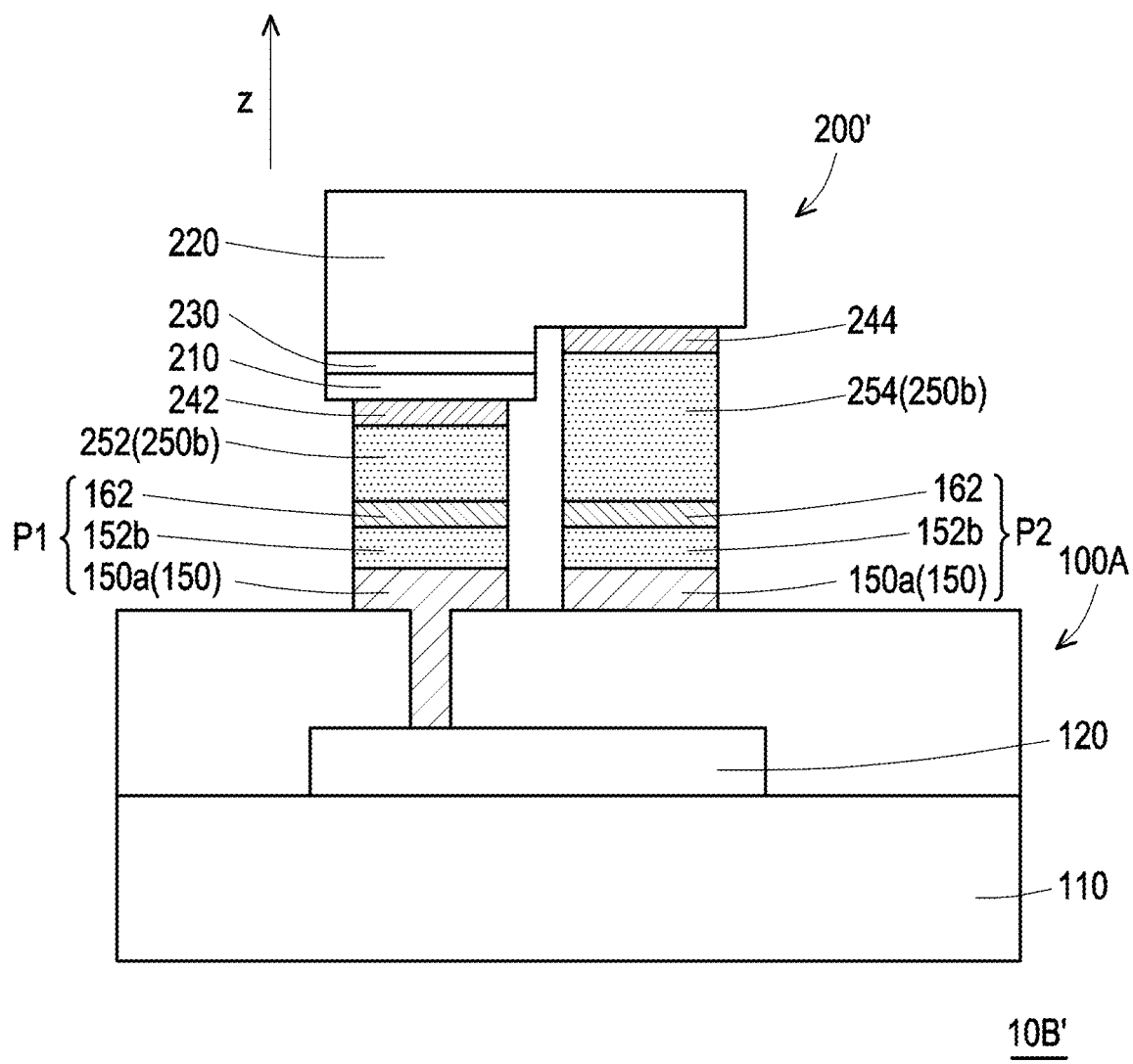

Please refer to FIGS. 6C and 6D. Next, the light-emitting element 200' for repair is disposed on the driving backplane 100A, and the electrodes 242 and 244 of the light-emitting element 200' are electrically connected to the remaining pads P1 and P2.

Specifically, in this embodiment, a heating process may be performed to eutectic bond the conductive bumps 252 and 254 of the light-emitting element 200' for repair and the remaining pads P1 and P2. During the eutectic bonding process, a part of the second metal layer 250 of the conductive bumps 252 and 254 reacts with the first metal layer 130 of the remaining pads P1 and P2 to form a third intermetallic layer 250b, and a part of the second metal layer 250 of the conductive bumps 252 and 254 passes through the auxiliary protective layer 160 and diffuses toward the auxiliary metal layer 150, so that a part 150b of the auxiliary metal layer 150 reacts with the part of the second metal layer 250 diffused therein to form a fourth intermetallic layer 152b.

In this embodiment, during the eutectic bonding process, the auxiliary protective layer 160 has the function of preventing continuous rapid diffusion. Due to the barrier function of the auxiliary protective layer 160, the part 150a of the first metal layer 150 of the pads P1 and P2 close to the substrate 110 does not react with other substances and retains the original properties of the auxiliary metal layer 150. In addition, during the eutectic bonding process, since a part of the second metal layer 250 passes through the auxiliary protective layer 160 and diffuses toward the auxiliary metal layer 150, a trace amount of the second metal in the second metal layer 250 also diffuses and remains in the auxiliary protective layer 160, so that the auxiliary protective layer 160 is transformed into a second diffusion barrier layer 162 with a trace amount of the second metal. Here, the repaired display apparatus 10B' is completed. In the repaired display apparatus 10B', the auxiliary metal layer 150, the fourth intermetallic layer 152b, the second diffusion barrier layer 162 and the third intermetallic layer 250b are sequentially stacked along the direction z away from the substrate 110.

To sum up, in the manufacturing process of the display apparatus according to an embodiment of the disclosure, the first protective layer may be sputtered on the first metal layer of the pad of the driving backplane. Before the driving backplane is bonded to the light-emitting element, the first protective layer may prevent the first metal layer of the pad from being oxidized, so as to ensure that the pad of the driving backplane may be smoothly bonded to the light-emitting element in the subsequent process. In the process of bonding the driving backplane and the light-emitting element, a part of the second metal layer of the conductive bump of the light-emitting element may pass through the first protective layer of the pad and diffuse to the first metal layer of the pad, and react with a part of the first metal layer of the pad to form a first intermetallic layer; thereby, the light-emitting element may be well bonded to the driving backplane.

Compared with a metal or its compound plated on the first metal layer of the pad by an electrochemical way, the first protective layer formed on the first metal layer of the pad by the sputtering process is unlikely to generate hazardous waste liquid, and the material cost is low.

What is claimed is:

1. A display apparatus comprising:
   a driving backplane comprising:
      a substrate;
      a pixel driving circuit disposed on the substrate; and
      a pad electrically connected to the pixel driving circuit, wherein the pad comprises a first metal layer, a first intermetallic layer and a first diffusion barrier layer, and the first metal layer, the first intermetallic layer and the first diffusion barrier layer are sequentially stacked along a direction away from the substrate; and
   a light-emitting element comprising:
      an electrode; and
      a conductive bump electrically connected to the electrode, wherein the conductive bump comprises a second intermetallic layer, and the first diffusion barrier layer is located between the second intermetallic layer and the first intermetallic layer.

2. The display apparatus according to claim 1, wherein the first metal layer comprises copper, and the first intermetallic layer comprises copper and tin.

3. The display apparatus according to claim 1, wherein the first metal layer comprises copper, and the second intermetallic layer comprises copper and tin.

4. The display apparatus according to claim 1, wherein the first intermetallic layer comprises $(Cu, Ni)_6Sn_5$, $(Cu, Ni)_3Sn$, $(Cu, Ni)_3Sn_4$ or a combination of at least two of the above.

5. The display apparatus according to claim 1, wherein the second intermetallic layer comprises $(Cu, Ni)_6Sn_5$, $(Cu, Ni)_3Sn$, $(Cu, Ni)_3Sn_4$, or a combination of at least two of the above.

6. The display apparatus according to claim 1, wherein the first diffusion barrier layer comprises tungsten and nickel.

7. The display apparatus according to claim 6, wherein the first diffusion barrier layer further comprises copper, tin, or a combination of copper and tin.

8. The display apparatus according to claim 6, wherein a weight percentage of tungsten in the first diffusion barrier layer falls within a range of 15% to 70%.

9. The display apparatus according to claim 6, wherein a weight percentage of nickel in the first diffusion barrier layer is greater than 5%.

10. The display apparatus according to claim 1, wherein the pad further comprises an auxiliary metal layer and an auxiliary protective layer, and the auxiliary metal layer, the auxiliary protective layer, the first metal layer, the first intermetallic layer, the first diffusion barrier layer and the second intermetallic layer are sequentially stacked along the direction away from the substrate.

* * * * *